(12) United States Patent
Vaiyapuri et al.

(10) Patent No.: US 6,207,467 B1
(45) Date of Patent: Mar. 27, 2001

(54) MULTI-CHIP MODULE WITH STACKED DICE

(75) Inventors: Venkateshwaran Vaiyapuri; Jicheng Yang, both of Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/437,595

(22) Filed: Nov. 10, 1999

(51) Int. Cl.[7] .......................... H01L 21/66; G01R 31/26
(52) U.S. Cl. ........................ 438/15; 438/118; 438/612; 257/738
(58) Field of Search ............................ 257/738; 438/18, 438/108, 118, 612, 613

(56) References Cited

U.S. PATENT DOCUMENTS 5,696,031 * 12/1997 Wark .
5,811,879    9/1998 Akram .
5,985,695 * 11/1999 Freyman et al. .

* cited by examiner

Primary Examiner—Kevin M. Picardat
Assistant Examiner—D. M. Collins
(74) Attorney, Agent, or Firm—Trop, Pruner & Hu, P.C.

(57) ABSTRACT

A multi-chip module may be formed by wire bonding a first chip within a cavity in a multi-chip carrier. A second die may be positioned over the first die, elevated therefrom, using bump bonding. In some embodiments, only a single cavity is utilized and in other embodiments, multiple cavities may be utilized, one of which mounts a first chip and the other of which mounts a second chip. In some embodiments, the second chip may be a composite of two dice coupled back-to-back so that the lowermost die may be bump bonded to the carrier and the uppermost die, facing upwardly away from the carrier, may be wire bonded thereto.

20 Claims, 3 Drawing Sheets

MULTI-CHIP MODULE WITH STACKED DICE

BACKGROUND

This invention relates generally to packaging integrated circuit dice in multi-chip modules.

In a variety of applications it is desirable to package more than one die in a single integrated circuit package. This may be the result of limits on the integratability of the components on the two dice into a single semiconductor die. These limitations may arise from the limits on the ability to integrate components into a single package. They may also arise from the fact that the components on the packages are incompatible with one another. For example, components on the two different dice may be subject to different voltage requirements. Alternatively, the two dice may require processing techniques which are incompatible.

In a number of cases, it may be desirable to package two dice into one package and to couple both dice through a common set of contacts to the outside world. Generally a die has a top side which contains contacts for making an electrical connection to the outside world and a bottom or backside. A challenge that arises is to put together a plurality of dice into a single package when each die can be only contacted on one side.

Thus, there is a continuing need for better ways to package multiple dice in a single package.

SUMMARY

In accordance with one aspect, a method of making multi-chip modules includes wire bonding a first die to contact in a first cavity of a structure. A second die is bump bonded through a contact on the structure over the first die. A solder ball is attached to the structure so that the solder ball is electrically coupled to the first and second dice.

Other aspects are set forth in the accompanying detailed description and claims.

DETAILED DESCRIPTION

Figure 1:
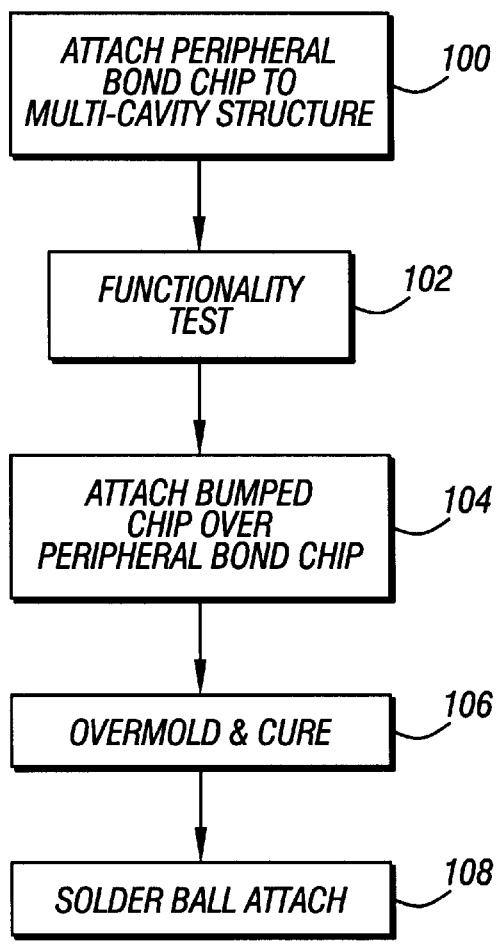
FIG. 1 is a process flow for one embodiment of the present invention.

A process for attaching more than one die to a carrier for making a multi-chip module is illustrated in FIG. 1. Initially, a peripheral bond chip is attached to a multicavity structure, as indicated at block 100. A peripheral bond chip includes a plurality of bond pads around its peripheral edges which are available for wire bonding. A multi-cavity structure is a chip carrier which includes more than one receiving area for integrated circuit dice or chips. In some cases, the multi-cavity structure includes die-receiving cavities which are vertically spaced with respect to one another. The die may be stacked one on top of the other with spacing between the dice.

After the peripheral bond chip has been attached by wire bonding, the resulting structure is tested in strip form for device functionality (block 102). Bad units are marked for subsequent flow identification and elimination from the assembly flow. In this way, the module may be tested prior to putting two dice into the module. This saves the cost of recovering the second die where either the module or the first inserted die is bad.

After the functionality test, the next step is to attach a bumped chip over the peripheral bond chip (block 104). The bumped chip is one which has solder bumps or solder balls which may be heat softened for attachment to other electrical devices.

After attaching the bumped chip, usually in a stacked arrangement over the peripheral bond chip, the entire assembly may be overmolded and cured (block 106). Thereafter solder balls are used to attach the module to peripheral components such as a printed circuit board, as indicated in block 108.

Figure 2:
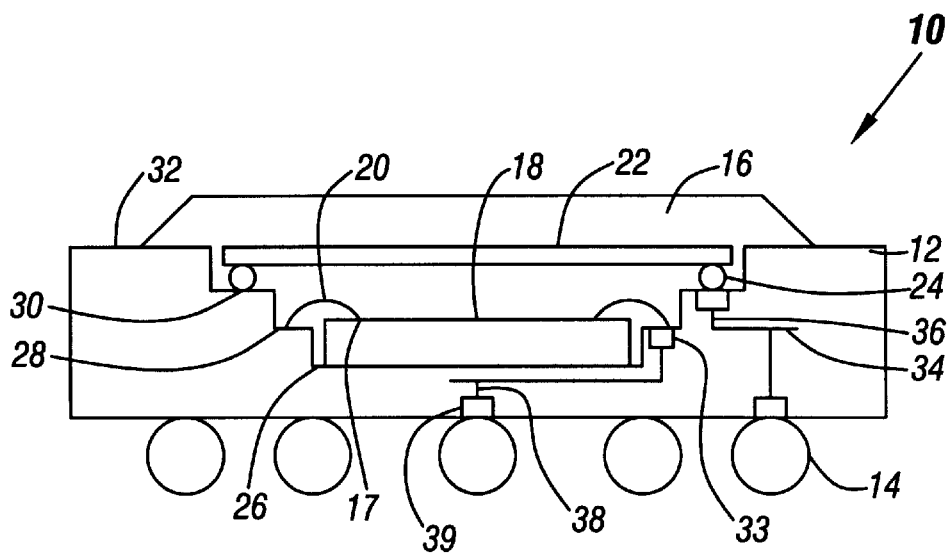
FIG. 2 is an enlarged cross-sectional view through one embodiment of the present invention.

Referring now to FIG. 2, a multi-chip module 10, made by the process illustrated in FIG. 1, includes a multicavity structure 12, a plurality of externally attached solder balls 14 and an overmolding 16. In this case, the structure 12 includes a set of three cavities including a lowermost cavity 26, a vertically upwardly displaced cavity 28 and an uppermost cavity 30. Thus, the cavities 26, 28 and 30 which become progressively larger from bottom to top, define a plurality of steps in the sidewalls of the structure 12.

A peripheral bond chip 18 is attached to the lowermost cavity 16 by wire bonding peripheral wire bond pads 17 on the chip to corresponding wire bond pads 33 on the second cavity 28. At this point, the entire assembly is tested.

Next, a bumped chip 22 is secured to the uppermost cavity 30 using bump bonding by way of solder balls or bumps 24. Thereafter, the entire assembly is overmolded so that the overmolding 16 actually covers a portion of the upper surface 32 of the structure 12.

The connections between the external solder balls 14 and the die 22 and 18 may be accomplished in a variety of ways. Where the structure 12 is a laminate, conductive traces 34 may extend through the structure 12 in a generally horizontal configuration. The traces 34 may be electrically isolated by intervening insulating layers. Vertical connections may be made to overlying contact pads on the cavities 28 and 30 by way of vias 36. Contacts may then be made downwardly to bond pads 39 coupled to the solder balls 14 by way of vias 38. Of course, other techniques may be utilized as well.

Thereafter, the package 10 may be surface mounted on a suitable device such as a printed circuit board (not shown). This is accomplished by simply positioning the module 10 on the board and heat reflowing to cause the solder balls 14 to physically and electrically couple the module 10 to the underlying device.

The lower die 18 may be physically connected to the structure 12 by way of a suitable die attach. A suitable die attach includes conductive paste, an adhesive tape, or adhesive such as an epoxy.

Figure 3:
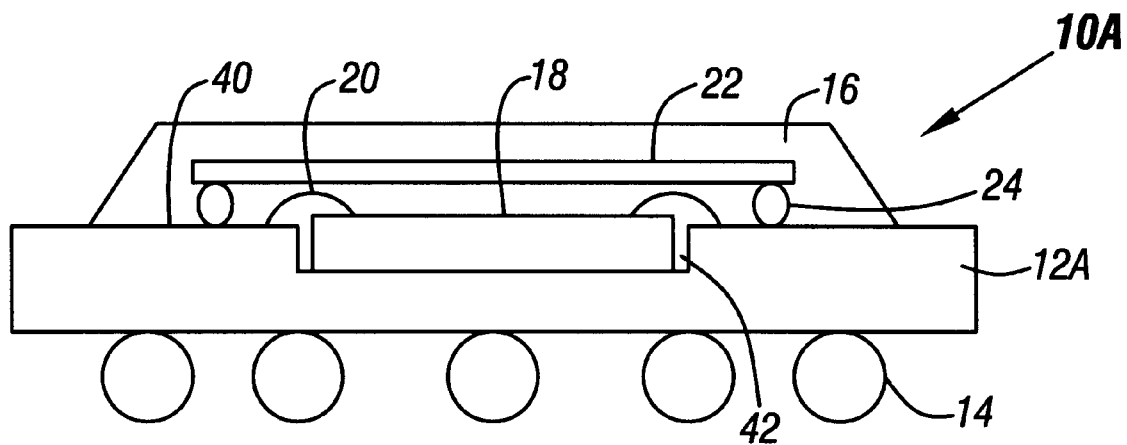
FIG. 3 is an enlarged cross-sectional view through another embodiment of the present invention.

Referring next to FIG. 3, a multi-chip module 10A includes a structure 12A. A die 18 is coupled to a cavity 42 using wire bond wires 20 as described previously in connection with the module 10 and the cavity 26. In this case, a die 22 is bump bonded to the upper surface 40 of the structure 12A. Again, bumps 24 are utilized to bump bond the die 22 to contacts in the upper surface 40 of the structure 12A. The connections from the bumps 24 and wire bonds 20 to the solder balls 14 may be made using any conventional technique, including the laminate technique illustrated in FIG. 2.

In effect, the overmolding 16 extends upwardly to accommodate the upper die 22. Overall, a lower profile may be attained. This is accomplished by eliminating in effect the second cavity and coupling the wires 20 and the bumps 24 to the same surface 40. This is generally not a problem because the wire bonding is done first before the upper die 22 is positioned. Then, the bumps 24 are made sufficiently large to provide adequate spacing over the wire bond wires 20.

Figure 4:
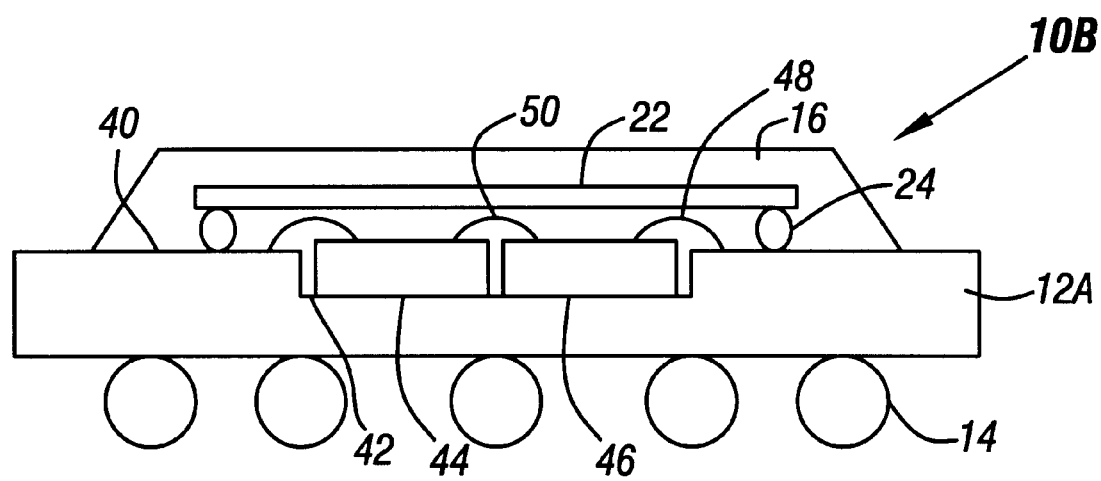
FIG. 4 is an enlarged cross-sectional view through still another embodiment of the present invention.

Turning next to FIG. 4, a multi-chip module 10B which receives three dice includes a structure 12A having an upper surface 40 as described previously in connection with FIG. 3. In addition, the structure 12A is electrically coupled (as described previously) to solder balls 14. In this case, a pair of dice 44 and 46 are secured to the cavity 42. The dice 44, 46 are wire bonded by way of wires 48 to contacts on the upper surface 40 and are bonded together by intervening wire bond wire 50. Thus, wire bonding may be completed while the dice 44 and 46 are exposed. The dice 44 and 46 may actually extend upwardly above the upper surface 40 of the cavity 42.

Thereafter, the die 22 is attached to the upper surface 40 as described previously. The entire assembly is overmolded again as described in connection with the embodiment of FIG. 3.

Figure 5:
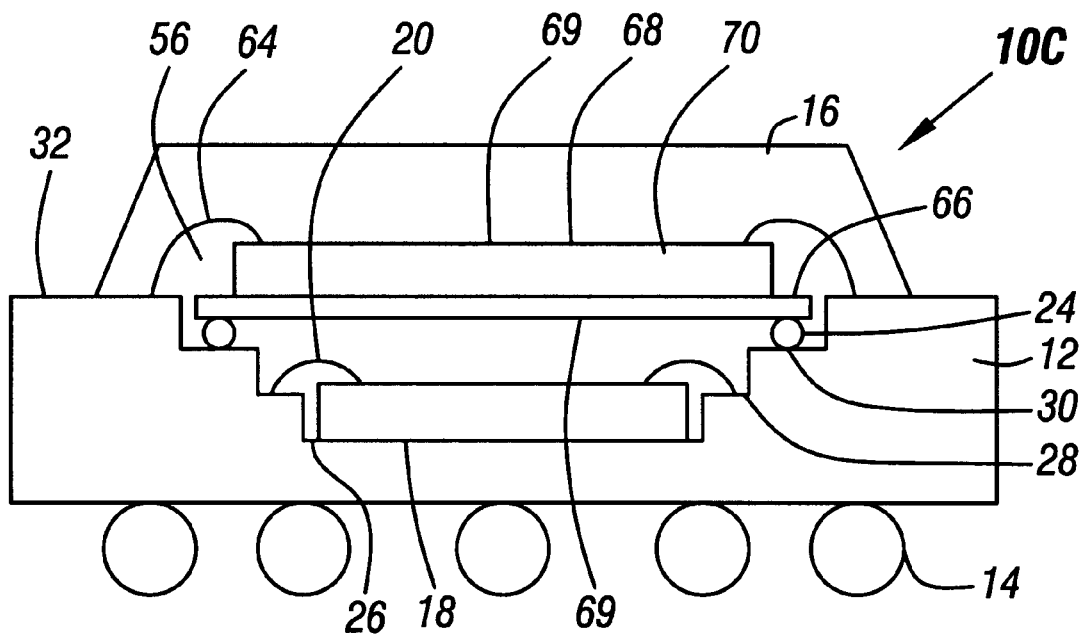
FIG. 5 is an enlarged cross-sectional view through yet another embodiment of the present invention.

Another multi-chip module 10C which can contain multiple die, shown in FIG. 5, includes a structure 12 as previously illustrated in connection with FIG. 2. The attachment of each die 18, 68 is generally as described above in connection with FIG. 2 except that a composite die 68 may be attached to the uppermost cavity 30. The composite die 68 may be made up of a pair of dice 66, 70 attached back-to-back so that their top sides 69 extend in opposite directions. A lower die 66 may extend beyond the upper die 70. The two die 66, 70 may be connected to one another using adhesive techniques, tape techniques, or conductive paste as examples.

The lower die 66 may be secured to the uppermost cavity 30 using bump bonding by way of bumps 24. The upper die 70 is then wire bonded, using peripheral wire bond contacts and bond wires 64 to the upper surface 32 of the structure 12. As before, the entire assembly is overmolded as indicated at 16. Electrical connections may be made through the structure 12 in any of a variety of ways, including the technique illustrated in FIG. 2.

Although an offset 56 is created between the two dice 66 and 70, this is not essential. The wire bonding can proceed in the same way even if the two dice have substantially the same dimensions.

Figure 6:
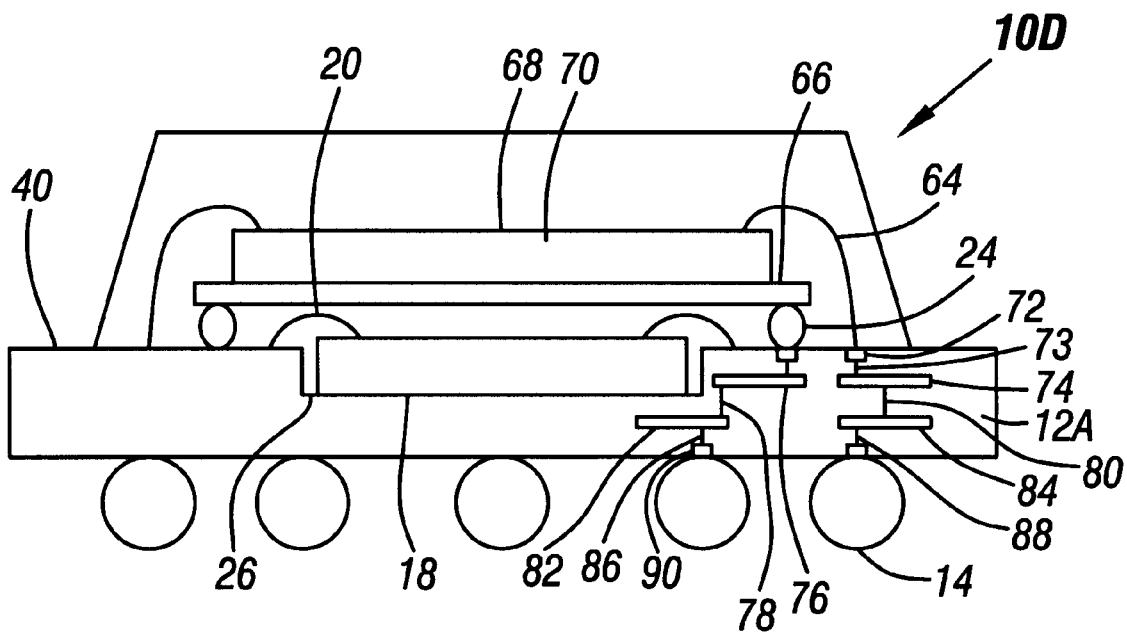
FIG. 6 is an enlarged cross-sectional view through another embodiment of the present invention.

Turning finally to FIG. 6, a module 10D with three dice includes a structure 12A of the type previously described in connection with FIG. 3. Again, solder balls 14 are provided on the lower external surface of the structure 12A. As before, a die 18 is secured in the cavity 26 using peripheral wire bond wire 20.

A composite die 68 is formed as described previously in connection with FIG. 5. A lower die 66 is bump bonded using bumps 24 to the upper surface 40 of the structure 12A. The upper die 68 is wire bonded, using wire bonds 64, to the upper surface 40. By extending the wire bonds 64 outwardly with respect to the bumps 24, both dice 66, 70 may be coupled to the same surface.

Separation or isolation of the signals may be possible by having vias which extend through the structure 12A to different depths. For example, as shown in FIG. 6, each of the wire bond wires 64 and bumps 24 may be coupled by a contact 72 through a via 73 to a trace 74, 76. The traces 74 and 76 may be formed at the same level within the carrier 12A but may be separated by an insulating gap. The gap may be defined during the photolithographic techniques used to form the trace layer. Vias 78 and 80 then extend downwardly to isolated traces 82 and 84. The traces 82 and 84 then contact by way of vias 86 and 88 to pads 90 which in turn are coupled to solder balls 14. While one technique has been described for coupling the signals independently to the solder balls 14, those skilled in the art will appreciate a number of other techniques for doing the same thing.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method for making multi-chip modules comprising:
   positioning a first die with its backside in a first cavity formed in a surface of a structure;
   wire bonding the top side of a first die in said first cavity of said structure;
   bump bonding a second die to said surface of said structure over said first die; and
   attaching a solder ball to said structure such that said solder ball is electrically coupled to said first and second dice.

2. The method of claim 1 further including securing a first die in a lower cavity of a structure having two spaced cavities and securing said second die to an upper cavity.

3. The method of claim 1 wherein said structure includes one cavity, said method further including securing said first die in said cavity and securing said second die on top of said structure.

4. The method of claim 1 including securing a third die to said first cavity alongside said first die.

5. The method of claim 4 including wire bonding said first and third dies directly together.

6. The method of claim 4 further including securing said second die to said surface of said structure.

7. The method of claim 1 further including securing a pair of dice in back-to-back relationship to form said second die.

8. The method of claim 7 including attaching one die of said combined second die using bump bonding and attaching the other die of said combined second die using wire bonding.

9. The method of claim 8 including attaching said first die to a first cavity below a second and third cavities, wire bonding said first die to said second cavity, wirebonding the surface of said structure to said second die and securing said second die to said third cavity.

10. The method of claim 7 including bump bonding said second die to said surface of said structure and wirebonding said second die to said surface of said structure.

11. A method of coupling a pair of chips to a carrier comprising:
    positioning a first chip in a cavity on a first side of said carrier;
    wire bonding said first chip to said first side of said carrier;
    bump bonding a second chip to said first side outwardly with respect to said first chip.

12. The method of claim 11 including mounting said second chip over said first chip on said first side.

13. The method of claim 11 including mounting a third chip in said cavity with said first chip.

14. The method of claim 11 including forming said second chip by securing a pair of dice in back to back relationship.

15. The method of claim 14 including wire bonding one of said dice to said first side and bump bonding the other of said dice to said first side.

16. A method of forming a multi-chip module comprising:

securing a first chip in a cavity in a carrier;

forming a second chip by securing a pair of dice together in back to back relationship; and securing said second chip to said carrier over said first chip.

17. The method of claim 16 including securing said second chip to a second cavity in said carrier over said first chip.

18. The method of claim 17 including bump bonding one of said dice to said second cavity over said first cavity.

19. The method of claim 16 including wire bonding said first chip to said carrier at a first location, bump bonding one of said dice to said carrier at a second location and wire bonding the other of said dice to said carrier at a third location, said first location being inwardly on said carrier with respect to said second location and said second location being inwardly on said carrier with respect to said third location.

20. The method of claim 19 including bonding said dice and said first chip to the same surface of said carrier.

* * * * *